(12) United States Patent
Schäuble et al.

(10) Patent No.: US 11,436,174 B2
(45) Date of Patent: Sep. 6, 2022

(54) CONFIGURATION SWITCH AND BUS PARTICIPANT COMPRISING SUCH A CONFIGURATION SWITCH

(71) Applicant: Endress+Hauser SE+Co. KG, Maulburg (DE)

(72) Inventors: Harald Schäuble, Lörrach (DE); Tobias Paul, Schopfheim (DE); Simon Gerwig, Schopfheim (DE); Max Bauer, Rheinfelden (DE)

(73) Assignee: ENDRESS+HAUSER SE+CO. KG, Maulburg (DE)

( * ) Notice: Subject to any disclaimer, the term of this patent is extended or adjusted under 35 U.S.C. 154(b) by 0 days.

(21) Appl. No.: 16/491,916

(22) PCT Filed: Feb. 15, 2018

(86) PCT No.: PCT/EP2018/053793
§ 371 (c)(1),
(2) Date: Sep. 6, 2019

(87) PCT Pub. No.: WO2018/171984
PCT Pub. Date: Sep. 27, 2018

(65) Prior Publication Data
US 2021/0133137 A1    May 6, 2021

(30) Foreign Application Priority Data
Mar. 24, 2017  (DE) ............ 10 2017 106 400.1

(51) Int. Cl.
*G06F 13/40* (2006.01)
*H03K 3/3565* (2006.01)

(52) U.S. Cl.
CPC ....... *G06F 13/4022* (2013.01); *H03K 3/3565* (2013.01)

(58) Field of Classification Search
CPC .. G02F 1/0121; G02F 1/13306; G06F 3/1423; G06F 3/1446; G06F 3/147;
(Continued)

(56) References Cited

U.S. PATENT DOCUMENTS 3,790,767 A * 2/1974 Alexander ............. G01R 29/02
  702/108
4,299,118 A * 11/1981 Gau ....................... G01N 11/14
  73/54.35

(Continued)

FOREIGN PATENT DOCUMENTS

CN      202794928 U    3/2013
DE       4118702 A1   12/1992

(Continued)

*Primary Examiner* — Faisal M Zaman
(74) *Attorney, Agent, or Firm* — Mark A. Logan; Endress+Hauser (USA) Holding Inc.

(57) ABSTRACT

Configuration switch-for setting a specific configuration from a plurality of settable configurations, wherein the configuration switch-has at least one plurality of selectable, mutually differing RC combinations, wherein each RC combination has at least one specific, characteristic variable, which is associated with a settable configuration and wherein to set the specific configuration a specific RC combination is selected/selectable, so that via an output signal-on an output-of the configuration switch, which output signal-comprises the specific, characteristic variable of the selected RC combination, the specific configuration to be set is established based on the specific, characteristic variable.

12 Claims, 1 Drawing Sheet

(58) Field of Classification Search
CPC .... G06F 13/4022; H03K 3/3565; H03K 3/36; H03K 3/353; G05B 19/106
USPC ........................................................ 359/296
See application file for complete search history.

(56) References Cited

U.S. PATENT DOCUMENTS

| | | | |
|---|---|---|---|
| 6,557,107 B1* | 4/2003 | Kim .................... | G06F 1/3228 713/320 |
| 9,268,349 B2* | 2/2016 | Hu ....................... | H03K 17/22 |
| 2003/0023777 A1 | 1/2003 | Fields | |
| 2008/0042701 A1 | 2/2008 | Weiss et al. | |
| 2008/0183919 A1* | 7/2008 | Bourne ............... | G06F 13/4077 710/52 |
| 2012/0025852 A1* | 2/2012 | Novak ................. | G01L 1/205 324/691 |
| 2014/0173013 A1* | 6/2014 | Liu ..................... | H04L 61/00 709/211 |
| 2014/0333373 A1* | 11/2014 | Pamarti ............... | H03H 19/00 327/553 |
| 2014/0367831 A1* | 12/2014 | Yen .................... | H01L 29/66166 257/595 |
| 2015/0043024 A1* | 2/2015 | Hiramatsu .......... | H04N 1/00904 358/1.14 |
| 2015/0251542 A1* | 9/2015 | Mensah-Brown ...... | B60L 50/51 307/10.1 |

FOREIGN PATENT DOCUMENTS

| | | |
|---|---|---|
| EP | 3021090 A1 | 5/2016 |
| WO | 8203477 A1 | 3/1982 |
| WO | 08203477 A1 | 10/1982 |

\* cited by examiner

CONFIGURATION SWITCH AND BUS PARTICIPANT COMPRISING SUCH A CONFIGURATION SWITCH

CROSS-REFERENCE TO RELATED APPLICATIONS

The present application is related to and claims the priority benefit of German Patent Application No. 10 2017 106 400.1, filed on Mar. 24, 2017 and International Patent Application No. PCT/EP2018/053793, filed on Feb. 15, 2018, the entire contents of which are incorporated herein by reference.

TECHNICAL FIELD

The invention relates to a configuration switch to set a specific configuration from a plurality of settable configurations as well as to a bus participant comprising such a configuration switch.

BACKGROUND

Configuration switches serve quite generally to allow an operator of a device, for example, a field device of automation technology, to set a specific configuration from a plurality of possible, settable configurations.

Field devices can serve for registering process variables. Examples of field devices include fill-level measuring devices, flow measuring devices, pressure- and temperature measuring devices, pH measuring devices, conductivity measuring devices, etc., which register the corresponding process variables, fill level, flow, pressure, temperature, pH value, and conductivity. Field devices serving for influencing process variables are actuators, such as valves or pumps, via which e.g. the flow of a liquid in a pipeline or the fill level of a medium in a container can be changed. Referred to as field devices are, in principle, all devices, which are applied near to a process and which deliver, or process, process relevant information. A large number of such field devices are manufactured and sold by the group of firms, Endress+Hauser. In connection with the invention, the concept, field device, includes, thus, all types of measuring devices and actuators. Furthermore, the concept, field device, includes also e.g. a gateway, a radio adapter or other bus participant integrated/integrable in a bus system.

Configuration switches in the case of field devices can be present, for example, in the form of address switches, via which a specific address is set in the field device. Configuration switches are used, however, not only to set a specific address, but, instead, for example, also to set a "high alarm" or a "low alarm".

In short, configuration switches are used anywhere, where an operator must set a device to a specific configuration. In order to be able to set a specific number of different configurations, a configuration switch requires, in general, a number of lines, such that in the binary number system there are a sufficient number of unique combinations. For example, a configuration switch requires 7 lines, in order to be able to set $2^7$ (two to the seventh power)=128 different configurations. Additionally, a configuration switch requires a hardware- and/or software mechanism, by means of which the operator can select a (single) specific configuration. Typically, I2C—I/O—expanders are used for this. In case no I2C port is available, or only a single pin, this can only be implemented with an additional processor. The additional processor requires, however, extra space on the electronics board and results in additional cost.

SUMMARY

It is, thus, an object of the invention to provide a configuration switch, in the case of which a specifically selected configuration can be determined, or read-out, with only a single line.

The object of the invention is achieved by a configuration switch for setting a specific configuration from a plurality of settable configurations, wherein the configuration switch has at least one plurality of selectable, mutually differing, resistance capacitance combinations (hereinafter abbreviated RC combinations), wherein each RC combination has at least one specific, characteristic variable, which is associated with a settable configuration and wherein to set a specific configuration a specific RC combination is selected/selectable, so that via an output signal on a (single) output of the configuration switch, which output signal comprises the specific, characteristic variable of the selected RC combination, the specific configuration to be set is established based on the specific, characteristic variable.

According to the invention, a configuration switch is provided with a plurality of RC combinations, in the case of which each RC combination has a characteristic variable and in the case of which the operator can select a specific RC combination, such that, based on an output signal, which is tappable on a (single) output, the specific configuration to be set is ascertainable based on the selected specific RC combination and, thus, based on the specific, characteristic variable for such RC combination.

An advantageous embodiment of the configuration switch provides that the specific configuration to be set and/or the plurality of settable configurations comprise an address of a bus participant, especially a slave address of a Profibus- and/or ModBus participant.

Another advantageous embodiment of the configuration switch provides that the configuration switch is, furthermore, embodied in such a manner that at least the RC combination selected to set the specific configuration is excited to self-oscillation. Especially, the embodiment provides that the characteristic variable comprises at least one frequency of the self-oscillating RC combination selected to set the specific configuration, so that the specific configuration to be set is determinable via the frequency of the output signal and/or that the configuration switch, furthermore, is embodied in such a manner that the RC combinations have mutually differing duty factors, so that the characteristic variable comprises supplementally a duty factor of the self-oscillating RC combination selected to set the specific configuration, so that the specific configuration to be set is, furthermore, determinable via the duty factor.

In turn, another advantageous embodiment of the configuration switch provides that the plurality of selectable, mutually differing RC combinations are implemented by the series connection of a capacitance with a parallel circuit having a plurality of parallel circuit branches, each of which comprises at least one mutually differing resistance and a switch connected therewith in series, and the configuration switch is, furthermore, embodied in such a manner that a specific RC combination is selectable by actuating at least one specific switch of the switches connected in series with the resistances. Especially, the embodiment can, furthermore, comprise a pull-up resistor, a switch element, especially a transistor, and a comparator, especially a Schmitt trigger, having a first and a different, second switching threshold, wherein the pull-up resistor in series with the capacitance and the parallel circuit is connected to a supply voltage and the comparator is connected in parallel with the parallel circuit, wherein the switch element is arranged in such a manner and controllable by the comparator such that the capacitance is chargeable via the resistance of the specifically selected RC combination and the pull-up resistor until reaching the first switching threshold and is dischargeable only via the resistance of the specifically selected RC combination and not the pull-up resistor until reaching the second switching threshold.

An alternative embodiment in this connection provides that the configuration switch is embodied in such a manner that, when the output signal on the output is drawn to a low-level, the capacitance discharges and, when the output signal on the output is switched to a high-Z, i.e. high resistance, the capacitance charges as a function of the specifically selected RC combination according to a specific time constant, wherein the characteristic variable comprises the specific time constant of the specifically selected RC combination, so that the specific configuration to be set is established via the output signal on the output of the configuration switch based on the specific time constant.

The object is achieved, furthermore, by a bus participant, especially a Profibus participant, comprising a configuration switch of an above described embodiment.

An advantageous embodiment of the bus participant includes, furthermore, a computing unit, especially a microprocessor, which is connected via a pin, preferably a single pin, with the output of the configuration switch, so that the computing unit is fed the output signal, which contains the characteristic variable, wherein the computing unit is adapted based on the characteristic variable to ascertain the specific configuration to be set.

An advantageous embodiment of the bus participant provides that the computing unit draws the output signal on the output to a low level, so that the capacitance discharges and draws the output signal on the output to a high level, so that the capacitance charges as a function of the specifically selected RC combination according to the specific time constant, wherein the computing unit is adapted, furthermore, to ascertain the specific configuration to be set based on the specific time constant as characteristic variable.

Another advantageous embodiment of the bus participant provides that the computing unit is designed to ascertain the characteristic variable via a Schmitt trigger input or by an analog to digital converter input.

BRIEF DESCRIPTION OF THE DRAWINGS

The invention will now be explained in greater detail based on the appended drawing, the figures of which show as follows:

FIG. 1 shows a schematic view of a first example of an embodiment of the configuration switch 1 of the invention. Configuration switch 1 includes a plurality of different RC combinations 2a, 2b, 2c and 2d, wherein each RC combination 2a, 2b, 2c and 2d has the same capacitance C, for example, in the form of a capacitor, and mutually differing resistances 1R, 2R, 4R and 8R connected in parallel with one another. Furthermore, the configuration switch 1 includes switches S1, S2, S3 and S4 enabling an operator to set a specific configuration, wherein each switch S1, S2, S3 and S4 is connected in series with an associated resistance 1R, 2R, 4R and 8R, respectively.

Figure 1:
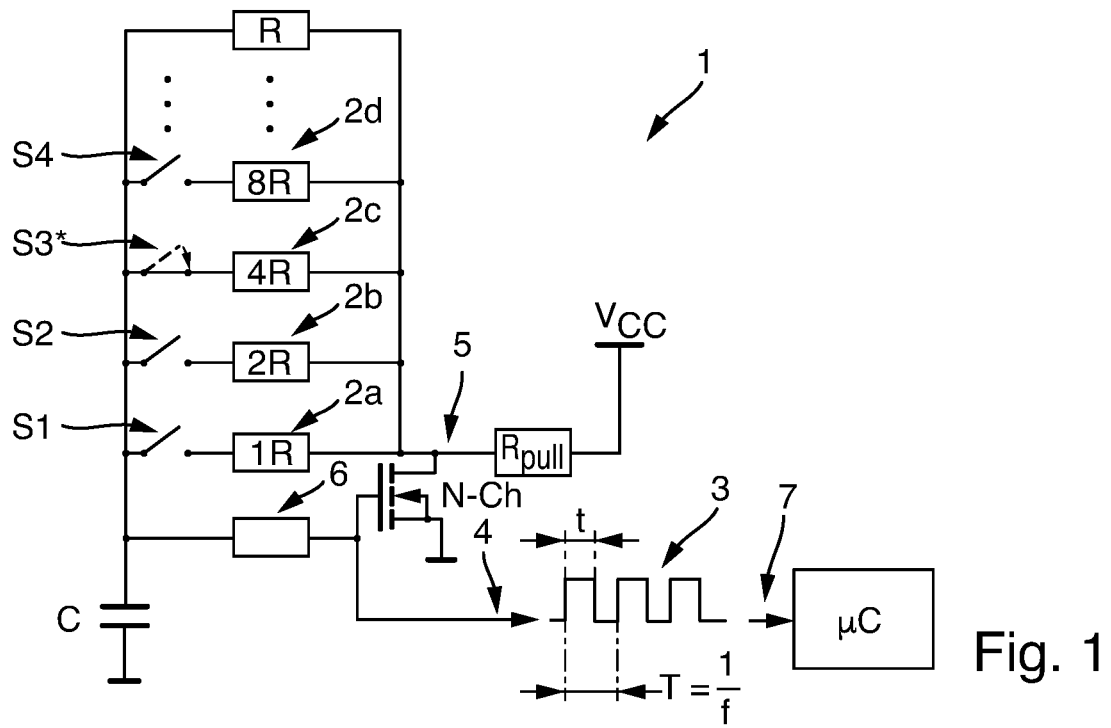
FIG. 1 shows a schematic view of a first example of an embodiment of a configuration switch of the invention.

In the case of the first example of an embodiment, a frequency is associated with each RC combination as its characteristic variable, so that the selection of a specific RC combination, and, thus, of a specifically set configuration, is determinable based on the frequency of a (single) output signal on a (single) output, i.e. a (single) output pin 4, of the configuration switch 1. In order to be able to associate with each RC combination a unique and mutually differing frequency as characteristic variable, the configuration switch 1 is embodied as a self-oscillating oscillator, whose oscillation frequency is influenceable by the connecting- and disconnecting of resistances by means of the switches S1, S2, S3 and S4. For this, the configuration switch 1 includes in the example of an embodiment of FIG. 1 a Schmitt trigger component 6, which is connected in such a manner that the capacitor C is charged up to an upper switching threshold via an additional resistor R, which is connected in parallel with the RC combinations 2a, 2b, 2c and 2d, and then discharged down to a lower switching threshold via the specifically selected RC combination (2c in FIG. 1), so that the output signal on the output has the specific, characteristic variable in the form of the frequency resulting from the selected RC combination.

In the example of an embodiment shown in FIG. 1, by way of example, the switch S3 is shown as closed, so that the output signal has the frequency corresponding to the selected RC combination (in the illustrated example, the 4 RC combination). In a preferred embodiment, the resistances of the RC combinations have values corresponding to the binary system, for example, 1k Ohm, 2k Ohm, 4k Ohm, 8k Ohm, etc.

Likewise in the first example of an embodiment, the configuration switch can have an N-channel MOSFET 5 and a pull-up resistor $R_{pull}$, wherein the gate of the MOSFET 5 is connected with an output of the Schmitt trigger, the source of the MOSFET 5 is connected with ground and the drain is connected via the pull-up resistor $R_{pull}$ with a supply voltage $V_{CC}$. Because of the MOSFET 5 and the pull-up resistor $R_{pull}$, supplementally to the frequency, also a duty cycle, or duty factor (defined as $\tau/T$, with $\tau$=pulse duration and T=period length) can be influenced, since the discharging of the capacitor only occurs via the resistances 1R, 2R, 4R and 8R, while the loading occurs through the pull-up resistor $R_{pull}$ at the supply voltage $V_{CC}$.

Figure 2:
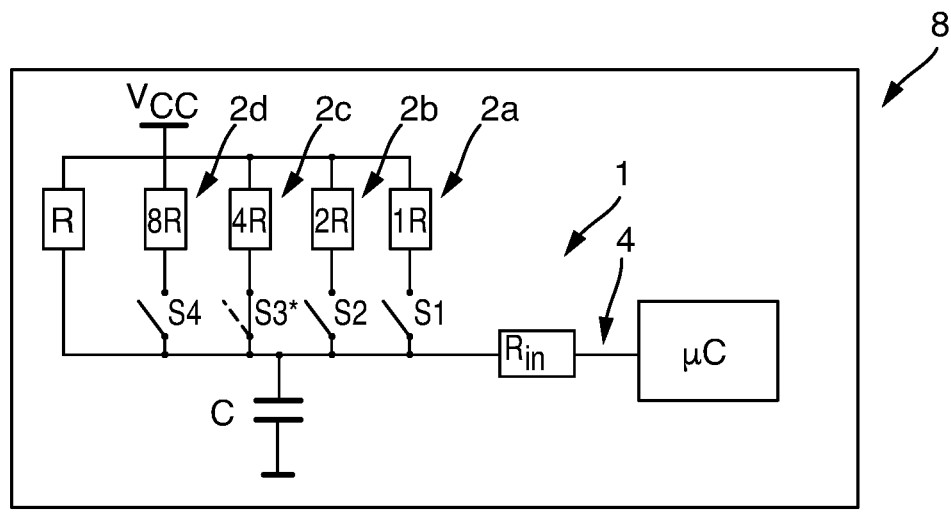
FIG. 2 shows a schematic view of a second, alternative example of an embodiment of the configuration switch of the invention.
Figure 2:
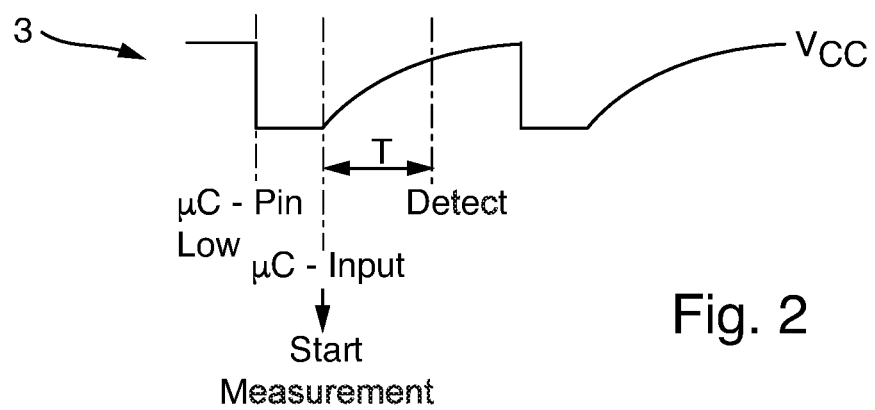

Alternatively to the frequency and, in given cases, the duty cycle as characteristic variable, the configuration switch 1 can, however, also be embodied in such a manner that a specific time constant, especially a charging time constant, is used as characteristic variable. FIG. 2 shows, in this connection, by way of example, a second example of an embodiment. In this example of an embodiment, the configuration switch 1 has likewise a plurality of different RC combinations 2a, 2b, 2c and 2d, wherein each RC combination 2a, 2b, 2c and 2d has the same capacitance C, for example, in the form of a capacitor, and mutually differing resistances 1R, 2R, 4R and 8R connected with one another in parallel. Furthermore, the configuration switch 1 likewise includes switches S1, S2, S3 and S4 enabling an operator to set specific configurations based on the plurality of different RC combinations 2a, 2b, 2c and 2d, wherein the switches S1, S2, S3 and S4 are connected in series with the resistances 1R, 2R, 4R and 8R, respectively. Furthermore, the configuration switch 1 likewise includes a resistor R, which is connected in parallel with the parallel resistances 1R, 2R, 4R and 8R and their switches S1, S2, S3 and S4. The configuration switch is connected with its output, i.e. output pin, via a resistor $R_{in}$ to a computing unit μC, for example, a microprocessor. The computing unit μC is adapted in such a manner that an input pin, to which the configuration switch 1 is connected with its output pin 4, is switchable to "low", i.e. low resistance, in order to discharge the capacitor C of the configuration switch 1 and then to "high Z", i.e. high resistance, in order to charge the capacitor C of the configuration switch 1. The switching to "high Z" by the computing unit μC can be achieved, for example, in that the computing unit switches the output, i.e. output pin 4, of the configuration switch to an input pin, i.e. input, of the computing unit μC. The RC combination selected by switch S1, S2, S3 and S4 influences the time constant, or charging time, and the computing unit μC can ascertain a corresponding specific configuration based on the time constant as characteristic variable.

The ascertaining of the time constant as characteristic variable can occur via a gate, which switches upon reaching an upper switching threshold ("High"), so that the time constant is ascertainable. The gate can be implemented both by an external component, i.e. one embodied away from the computing unit, as well as also by an internal component, i.e. one within the computing unit. For example, a Schmitt trigger input or even an analog to digital converter input (ADC) of the computing unit μC can be used. The signal curve shown in FIG. 2 illustrates this, by way of example, in that, first, the output of the configuration switch is drawn to a low level through the computing unit μC, in order to discharge the capacitance and then the output is switched high-Z, for example, in that the computing unit switches the output of the configuration switch internally to an input, so that the capacitance can charge. Then, the charging behavior and, thus, the time constant can be ascertained, such as above described.

The configuration switches shown in FIGS. 1 and 2 can be integrated together with the computing unit μC in a bus participant 8, for example, a Profibus- or ModBus participant. In the bus participant 8, the configuration switch 1 can serve, for example, to set a slave address of the bus participant 8. In such case, 128 (=2^7) different addresses can be set in the present examples of embodiments by corresponding actuation of the switches S1, S2, S3 and S4.

By way of example, both in the first as well as also the second example of an embodiment, the switch S3 is shown as specifically actuated (marked with an asterisk), so that either the specific frequency resulting for the RC combination with the 4R resistance (and, in given cases, also its duty cycle) or the specific time constant serves as characteristic variable, which is correspondingly ascertained by the computing unit μC and associated with a specific configuration, for example, a specific slave address.

LIST OF REFERENCE CHARACTERS 1 configuration switch
2a, 2b, 2c, 2d RC combinations
3 output signal
4 output, output pin
5 switch element
6 comparator, especially Schmitt trigger
7 individual pin of the microprocessor
8 bus participant, especially profibus participants
1R, 2R, 4R, 8R resistances with resistance value of R, 2R, 4R, 8R
C capacitance
$R_{pull}$ pull-up resistor
μC computing unit, microprocessor

The invention claimed is:

1. A configuration switch for setting a specific configuration from a plurality of settable configurations, comprising:
a plurality of selectable, mutually differing resistive-capacitive (RC) combinations implemented by a series connection of a capacitance and a parallel circuit having a plurality of parallel circuit branches each of which includes at least one mutually differing resistance and a switch connected in series with the resistance, wherein a specific RC combination is selectable by actuating at least one specific switch, and wherein each of the plurality of RC combinations has at least one specific, characteristic variable that is associated with a settable configuration;
a pull-up resistor connected in series with the capacitance and the parallel circuit and further connected to a supply voltage;
a switch element, including a transistor switch;
a comparator including a Schmitt trigger having a first switching threshold and a different, second switching threshold, wherein the comparator is connected in parallel with the parallel circuit and
an output,
wherein to set a specific configuration, a specific RC combination of the plurality of RC combinations is selectable,
wherein the switch element is arranged in such a manner and is controllable by the comparator such that the capacitance is chargeable via the resistance of the specifically selected RC combination and the pull-up resistor until reaching the first switching threshold and is dischargeable only via the resistance of the specifically selected RC combination and not the pull-up resistor until reaching the second switching threshold,
wherein an output signal on the output of the configuration switch includes the specific, characteristic variable of the selected RC combination, and
wherein the specific configuration to be set is established based on the specific, characteristic variable.

2. The configuration switch as claimed in claim 1, wherein the specific configuration to be set and/or the plurality of settable configurations comprise an address of a bus participant, including a slave address of a Profibus- and/or ModBus participant.

3. The configuration switch as claimed in claim 1, wherein the configuration switch is further embodied in such a manner that at least the RC combination selected to set the specific configuration is excited to self-oscillation.

4. The configuration switch as claimed in the claim 3, wherein the characteristic variable includes at least one frequency of the self-oscillating RC combination selected to set the specific configuration so that the specific configuration to be set is determinable via the frequency of the output signal.

5. The configuration switch as claimed in claim 3, wherein the configuration switch is further embodied in such a manner that the RC combinations have mutually differing duty factors, so that the characteristic variable includes supplementally a duty factor of the self-oscillating RC combination selected to set the specific configuration, so that the specific configuration to be set is determinable via the duty factor.

6. The configuration switch as claimed in claim 1, wherein the configuration switch is further embodied in such a manner that when the output signal on the output is drawn to a low level, the capacitance discharges, and when the output signal on the output is switched to a high impedance, the capacitance charges as a function of the specifically selected RC combination according to a specific time constant, wherein the characteristic variable includes the specific time constant of the specifically selected RC combination, so that the specific configuration to be set is established via the output signal on the output of the configuration switch based on the specific time constant.

7. A bus participant, comprising:
a configuration switch, including:
   a plurality of selectable, mutually differing resistive-capacitive (RC) combinations implemented by a series connection of a capacitance with a parallel circuit having a plurality of parallel circuit branches each of which includes at least one mutually differing resistance and a switch connected in series with the resistance, wherein each of the plurality of RC combinations has at least one specific, characteristic variable that is associated with a settable configuration; and
   an output,
   wherein to set a specific configuration, a specific RC combination of the plurality of RC combinations is selectable by actuating at least one specific switch,
   wherein an output signal on the output of the configuration switch includes the specific, characteristic variable of the selected RC combination, and
   wherein the specific configuration to be set is established based on the specific, characteristic variable;
a pull-up resistor connected in series with the capacitance and the parallel circuit and further connected to a supply voltage;
a switch element, including a transistor switch;
a comparator including a Schmitt trigger having a first switching threshold and a different, second switching threshold, wherein the comparator is connected in parallel with the parallel circuit; and
a computing unit, including a microprocessor, which is connected via a pin with the output of the configuration switch, so that the computing unit is fed the output signal which contains the characteristic variable, wherein the computing unit is adapted based on the characteristic variable to ascertain the specific configuration to be set from a plurality of settable configurations,
wherein the switch element is arranged in such a manner and is controllable by the comparator such that the capacitance is chargeable via the resistance of the specifically selected RC combination and the pull-up resistor until reaching the first switching threshold and is dischargeable only via the resistance of the specifically selected RC combination and not the pull-up resistor until reaching the second switching threshold.

8. The bus participant as claimed in claim 7, wherein the computing unit is further adapted to draw the output signal on the output to a low level, so that the capacitance discharges, and, after the discharging, to switch the output signal on the output to a high impedance, so that the capacitance charges as a function of the specifically selected RC combination according to the specific time constant, wherein the computing unit is adapted, furthermore, to ascertain the specific configuration to be set based on the specific time constant as characteristic variable.

9. The bus participant as claimed in claim 8, wherein the computing unit is designed to ascertain the characteristic variable via a Schmitt trigger input or by an analog to digital converter input.

10. The bus participant according to claim 7,
wherein the configuration switch is embodied as a self-oscillating oscillator having a frequency set by the specifically selected RC combination,
wherein the computing unit is further adapted to determine the frequency of oscillation of the configuration switch from the output signal, and
wherein the computing unit is further adapted to set the specific configuration based on the frequency of oscillation.

11. The bus participant according to claim 7,
wherein the configuration switch is embodied as a self-oscillating oscillator having a frequency set by the specifically selected RC combination,
wherein the configuration switch is further embodied such that the RC combinations have mutually differing duty factors,
wherein the computing unit is further adapted to determine the frequency of oscillation of the configuration switch from the output signal and to determine a duty factor of the output signal, and
wherein the computing unit is further adapted to set the specific configuration based on the duty factor of the output signal.

12. The bus participant according to claim 10,
wherein the specific configuration is a bus address of the bus participant.

* * * * *